(12) United States Patent
Akiyama et al.

(10) Patent No.: US 7,615,456 B2
(45) Date of Patent: Nov. 10, 2009

(54) METHOD FOR MANUFACTURING SOI SUBSTRATE

(75) Inventors: Shoji Akiyama, Gunma (JP); Yoshihiro Kubota, Gunma (JP); Atsuo Ito, Gunma (JP); Makoto Kawai, Gunma (JP); Yuuji Tobisaka, Gunma (JP); Koichi Tanaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/076,923

(22) Filed: Mar. 25, 2008

(65) Prior Publication Data

US 2008/0254597 A1 Oct. 16, 2008

(30) Foreign Application Priority Data

Apr. 11, 2007 (JP) .............................. 2007-103579

(51) Int. Cl.
*H01L 21/331* (2006.01)
*H01L 21/8222* (2006.01)

(52) U.S. Cl. ........................ 438/311; 438/475; 438/510; 257/E21.054; 257/E21.218; 257/E21.227; 257/E21.248; 257/E21.304

(58) Field of Classification Search ................. 438/311, 438/8, 9, 506, 510, 513, 474, 475, 663, 692, 438/733, 931
See application file for complete search history.

(56) References Cited

U.S. PATENT DOCUMENTS 5,213,986 A 5/1993 Pinker et al.

(Continued)

FOREIGN PATENT DOCUMENTS

| EP | 0 676 796 A2 | 10/1995 |
| EP | 0 706 203 A1 | 1/1996 |
| JP | B2-3048201 | 3/2000 |

OTHER PUBLICATIONS

A.-J. Auberton-Herve et al. "Smart Cut Technology: Industrial Status of SOI Wafer Production and New Material Developments;" *Electrochemical Society Proceedings*; vol. 99-3 (1999) p. 93-106).
Q.-Y. Tong et al., "Thinning Procedures;" *Semiconductor Wafer Bonding* Wiley (1998) pp. 137-172.
Sato et al., "Hydrogen Annealed Silicon-on-insulator", Applied Physics Letters, vol. 65, No. 15, pp. 1924-1926, (1994).

*Primary Examiner*—David Nhu
(74) *Attorney, Agent, or Firm*—Oliff & Berridge, PLC

(57) ABSTRACT

A method for manufacturing an SOI substrate superior in film thickness uniformity and resistivity uniformity in a substrate surface of a silicon layer having a film thickness reduced by an etch-back method is provided. After B ions is implanted into a front surface of a single-crystal Si substrate 10 to form a high-concentration boron added p layer 11 having a depth L in the outermost front surface, the single-crystal Si substrate 10 is appressed against a quartz substrate 20 to be bonded at a room temperature. Chemical etching is performed with respect to the single-crystal Si substrate 10 from a back surface thereof to set its thickness to L or below. A heat treatment is carried out with respect to an SOI substrate in a hydrogen containing atmosphere to outwardly diffuse B from the high-concentration boron added p layer 11, thereby acquiring a boron added p layer 12 having a desired resistance value. During this heat treatment, B in an Si crystal is diffused to the outside of the crystal in a state where it is coupled with hydrogen in the atmosphere, and a B concentration in the high-concentration boron added p layer 11 is reduced. In regard to a heat treatment temperature at this time, in view of a softening point of the insulative substrate, an upper limit of the heat treatment temperature is set to 1250° C., and 700° C. is selected as a lower limit of the temperature at which B can be diffused.

12 Claims, 1 Drawing Sheet

U.S. PATENT DOCUMENTS

| | | | |
|---|---|---|---|
| 5,453,394 A | * | 9/1995 | Yonehara et al. ............ 438/311 |
| 5,559,043 A | * | 9/1996 | Bruel ......................... 438/475 |
| 5,856,229 A | * | 1/1999 | Sakaguchi et al. .......... 438/406 |
| 5,985,728 A | | 11/1999 | Jennings |
| 6,263,941 B1 | | 7/2001 | Bryan et al. |
| 6,306,729 B1 | * | 10/2001 | Sakaguchi et al. .......... 438/458 |
| 6,429,095 B1 | * | 8/2002 | Sakaguchi et al. .......... 438/458 |
| 6,513,564 B2 | | 2/2003 | Bryan et al. |
| 6,582,999 B2 | * | 6/2003 | Henley et al. ............... 438/221 |
| 2006/0073644 A1 | | 4/2006 | Atoji et al. |

* cited by examiner

METHOD FOR MANUFACTURING SOI SUBSTRATE

BACKGROUND OF THE INVENTION

1. Field of the Invention

The present invention relates to a method for manufacturing an SOI substrate having a silicon thin film on an insulative substrate.

2. Description of the Related Art

As a method for manufacturing an SOI substrate having a silicon thin film on an insulative substrate, there has been conventionally known a SmartCut method (e.g., Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106).) for bonding a silicon substrate having hydrogen ions implanted on a bonding front surface side to a support substrate and then performing a heat treatment at approximately 500° C. or above to thermally delaminate a silicon thin film from a region where a concentration of the implanted hydrogen ions is maximum or an SiGen method (e.g., Specification in U.S. Pat. No. 6,263,941, Specification in U.S. Pat. No. 6,513,564 and Specification in U.S. Pat. No. 6,582,999) for performing a plasma treatment to bonding front surfaces of a silicon substrate having hydrogen ions implanted on a bonding front surface side and a silicon substrate or a substrate formed of any other material before bonding these substrates, then bonding both the substrates in a state where the front surfaces of these substrates are activated, carrying out a heat treatment at a low temperature (e.g., 100 to 300° C.) to increase bonding strength, and thereafter carrying out mechanical delamination at an ordinary temperature to obtain an SOI substrate.

In addition to such techniques, an "etch-back method" has been recently proposed as a technology of reducing a film thickness of a silicon layer of a bonded SOI substrate (see, e.g., Q. -Y. Tong, U. Goesele et al., "Semiconductor Wafer Bonding" Wiley (1998) Chapter 6. and others). According to this technique, boron (B) is ion-implanted or diffused in a front surface layer of a silicon wafer (a bond wafer) serving as an active layer to form a high-concentration p layer (a $p^{++}$ layer) in which a B concentration is, e.g., $10^{19}/cm^3$ or above (a specific resistance is approximately 0.01 Ωcm or below), and this wafer is bonded to a support substrate (a base wafer), and then the bond wafer is chemically etched from a back surface thereof to reduce a film thickness.

This etch-back method utilizes "etching selectivity" that an alkaline solution that is used to chemically etch a silicon crystal has a relatively high etching rate with respect to a silicon crystal having no boron added thereto or a silicon crystal having a general boron concentration but, on the other hand, it has a very low etching rate with respect to a silicon crystal having boron added thereto at a high concentration. It is to be noted that this "etching selectivity" (a selection ratio) is dependent on a boron concentration ratio in a crystal, but it usually falls within the range of 1 to 1000 and takes a higher value when a boron concentration ratio is increased.

However, since a silicon layer whose film thickness is reduced by the etch-back method has a very low resistance (a specific resistance of approximately 0.01 Ωcm or below), this resistance greatly deviates from a resistivity (a specific resistance of approximately 0.1 to 100 Ωcm) suitable for a general semiconductor device, and an application range cannot be help becoming narrow. Further, when a boron concentration of a p layer is adjusted to approximately 0.1 to 100 Ωcm in a specific resistance in order to set a resistivity of a silicon layer having a reduced film thickness to a resistivity suitable for a general semiconductor device, the above-explained "etching selectivity" (a selection ratio) cannot be sufficiently obtained, and uniformly acquiring a desired layer thickness in a substrate surface becomes difficult.

In view of such a problem, it is an object of the present invention to provide a method for manufacturing an SOI substrate which is superior in film thickness uniformity and resistivity uniformity of a silicon layer (an SOI layer) having a film thickness reduced by the etch-back method in a substrate surface.

SUMMARY OF THE INVENTION

To achieve this object, a method for manufacturing an SOI substrate according to the present invention comprises: a step A of bonding a front surface of a silicon substrate having a high-concentration boron added p layer having a depth L in the outermost front surface to a front surface of an insulative substrate; a step B of reducing a sheet thickness of the bonded silicon substrate from a back surface thereof by a sheet thickness reducing technique including at least a chemical etching step to set a thickness of the silicon substrate to L or below; and a step C of performing a heat treatment with respect to the silicon layer having the thickness which is L or below in a hydrogen containing atmosphere.

A specific resistance of the high-concentration boron added p layer is, e.g., 0.01 Ωcm or below, and the depth L of the high-concentration boron added p layer from the outermost front surface of the silicon substrate is, e.g., 10 μm or below.

Furthermore, an etchant used for the chemical etching is an alkaline solution containing, e.g., KOH, NaOH, CsOH, $NH_4OH$, EDP (Ethylenediamine-pyrocatechol), or TMAH (Tetramethyl ammonium hydroxide), and a heat treatment temperature in the hydrogen containing atmosphere is in the range of, e.g., 700° C. to 1250° C.

In the present invention, the step A preferably comprises: a front surface treatment step of performing an activation treatment with respect to the front surface of at least one of the insulative substrate and the silicon substrate; and a step of bonding the front surface of the insulative substrate to the front surface of the silicon substrate at a room temperature.

Moreover, it is preferable for the activation treatment to be at least one of a plasma treatment and an ozone treatment.

The insulative substrate used in the present invention is formed of, e.g., quartz, sapphire, borosilicate glass, crystallized glass, or a silicon carbide.

In the present invention, since the heat treatment is performed with respect to the SOI layer having a film thickness reduced by the etch-back method in a hydrogen containing atmosphere, hydrogen facilitates out diffusion of B in the SOI layer. As a result, a final resistivity of the SOI layer can fall within the range of a resistivity suitable for a general semiconductor device. Moreover, the SOI layer is superior in film thickness uniformity and resistivity uniformity in the substrate surface, thereby obtaining the high-quality SOI substrate.

DETAILED DESCRIPTION OF THE PREFERRED EMBODIMENT

Figure 1:
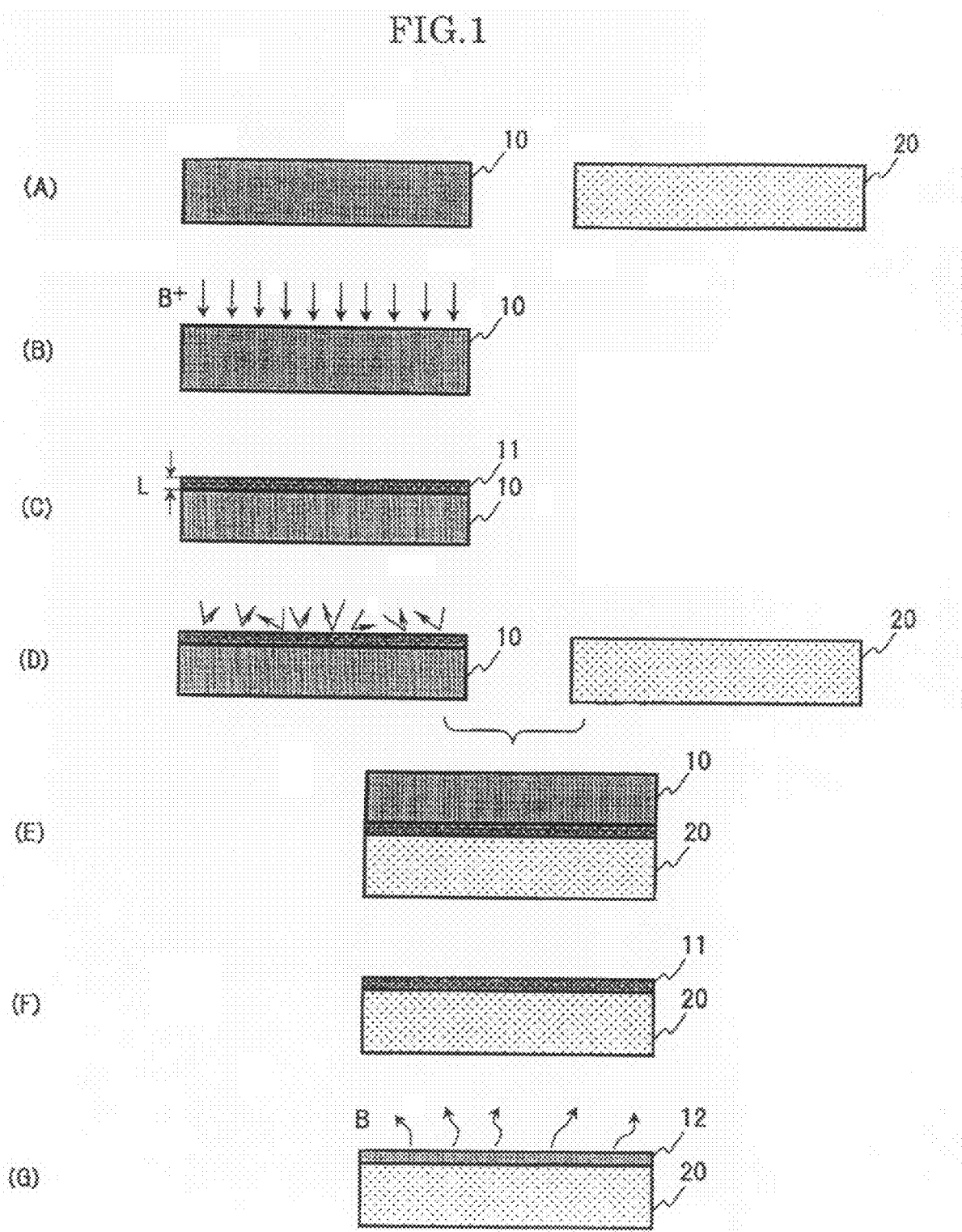
FIG. 1 are views for explaining a process example of a method for manufacturing an SOI substrate according to the present invention.

A method for manufacturing an SOI substrate according to the present invention will now be explained hereinafter based on an embodiment. In this embodiment, although an insulative substrate will be explained as a quartz substrate, the insulative substrate may be a sapphire substrate, a borosilicate glass substrate, a crystallized glass substrate, or a silicon carbide substrate.

Embodiment

FIG. 1 are views for explaining a process example of a method for manufacturing an SOI substrate according to the present invention. It is to be noted that an oxide film is not provided on a front surface of a silicon substrate in this embodiment, a silicon substrate having an oxide film formed on a front surface thereof in advance may be used.

A silicon substrate 10 depicted in FIG. 1(A) is a bond wafer, and a quartz substrate 20 is a support substrate (a base wafer). The silicon substrate 10 is a generally commercially available B-doped single-crystal Si substrate grown based on a CZ method (a Chochralski method), and its specific resistivity is approximately 10 Ωcm (approximately $10^{15}/cm^3$ in B concentration). It is to be noted that a conductivity type, an electrical characteristic value such as a specific resistivity, a crystal orientation, or a crystal diameter of the silicon substrate 10 is appropriately selected in dependence on a design value or a process of a device adopting an SOI substrate manufactured by the method according to the present invention or a display area of a device to be manufactured.

The single-crystal Si substrate 10 and the quartz substrate 20 have the same diameter. When the same orientation flat (OF) as an OF provided on the single-crystal Si substrate 10 is likewise provided on the quartz substrate 20 and these substrates are bonded while matching these OFs with each other, this will be convenient for a subsequent device formation process.

First, B ions are implanted into a front surface of the single-crystal Si substrate 10 (FIG. 1(B)). This ion implanted front surface serves as a bonding front surface (a joint front surface) at a later step. Based on this B ion implantation, a high-concentration boron added p layer 11 having a depth L is formed on the outermost front surface of the single-crystal Si substrate 10 (FIG. 1(C)).

A dose amount at the time of B ion implantation is selected in such a manner that the above-explained "etching selectivity" (a selection ratio) takes a sufficiently high value. In this embodiment, a B concentration of the high-concentration boron added p layer 11 is set to approximately $10^{19}/cm^3$ so that a specific resistance of this layer becomes approximately 0.01 Ωcm.

The depth L of the high-concentration boron added p layer 11 from the outermost front surface of the single-crystal Si substrate 10 is controlled by an acceleration voltage at the time of ion implantation, and it is set to approximately 3 μm in this embodiment although it is also dependent on a thickness of an SOI layer to be finally obtained. It is to be noted that the deep (thick) high-concentration boron added p layer 11 having a thickness of 5 μm or above may be provided by the technique according to the present invention. However, when the value of L is too large, an ion implantation damage becomes too serious, and hence adopting a depth of 10 μm or below is preferable.

It is to be noted that an insulative film such as an oxide film may be formed on the ion implanted front surface of the single-crystal Si substrate 10 in advance and ion implantation may be carried out through this insulative film, which is usually performed to suppress channeling of an implanted ions in a process of implanting the ions into an Si crystal. In general, a heat treatment for remedying a damage is performed by a known technique after this B implantation. However, when a temperature of the later-explained heat treatment in a hydrogen atmosphere is sufficiently high, the heat treatment in the hydrogen atmosphere may also serve as a damage remedying treatment to omit the damage remedying treatment at this stage. Additionally, the high-concentration boron added p layer 11 may be formed based on a diffusion method without ion implantation.

The damage remedying treatment is carried out after B implantation, and then a plasma treatment or an ozone treatment is performed with respect to a main front surface of the single-crystal Si substrate 10 for the purpose of front surface cleaning or front surface activation (FIG. 1(D)). Such a front surface treatment is carried out to remove an organic material on the front surface serving as the bonding front surface or increase an OH group on the front surface, thereby achieving front surface activation. It is to be noted that such a front surface treatment may be performed with respect to the main front surface of at least one of the single-crystal Si substrate 10 and the quartz substrate 20.

When performing this front surface treatment based on the plasma treatment, the single-crystal Si substrate and/or the quartz substrate having the front surface cleaned by RCA cleaning in advance is mounted on a sample stage in a vacuum chamber, and a plasma gas is introduced into the vacuum chamber to provide a predetermined degree of vacuum. It is to be noted that, as the plasma gas type used in this process, there is an oxygen gas, a hydrogen gas, an argon gas, a mixed gas of these gases, or a mixed gas of the hydrogen gas and a helium gas. After introducing the plasma gas, a high-frequency plasma having a power of approximately 100 W is generated, the treatment is performed with respect to the front surface of the single-crystal Si substrate and/or the quartz substrate as a plasma treatment target for approximately 5 to 10 seconds, and then the treatment is terminated.

When performing the front surface treatment based on the ozone treatment, the single-crystal Si substrate and/or the quartz substrate having the cleaned front surface is mounted on a sample stage in a chamber having an oxygen containing atmosphere, and a plasma gas such as a nitrogen gas or an argon gas is introduced into this chamber. Then, a high-frequency plasma having a predetermined power is generated, oxygen in the atmosphere is converted into ozone by using this plasma, and the treatment is carried out with respect to the front surface of the single-crystal Si substrate and/or the quartz substrate as a treatment target for a predetermined time.

The main front surfaces of the single-crystal Si substrate 10 and the quartz substrate 20 subjected to the front surface treatment are pressed against each other to be bonded at a room temperature (FIG. 1(E)). As explained above, since the front surface (the bonding front surface) of at least one of the single-crystal substrate 10 and the quartz substrate 20 is activated because of the front surface treatment, e.g., the plasma treatment or the ozone treatment, it has bonding strength that can sufficiently resist handling in chemical etching or mechanical polishing at a later step even in an appressed (bonded) state at a room temperature.

It is to be noted that a step of performing a heat treatment at a relatively low temperature (100 to 300° C.) in a state where the single-crystal Si substrate 10 and the quartz substrate 20 are bonded may be provided after the bonding step depicted in FIG. 1(E). This heat treatment step is mainly intended to obtain an effect increasing the bonding strength of the single-crystal Si substrate 10 and the quartz substrate 20.

It is to be noted that a main reason that the heat treatment temperature is set to 300° C. or below is a consideration on a thermal expansion coefficient difference between the single-crystal silicon and the quartz, a strain amount due to this thermal expansion coefficient difference, and a relationship between this strain amount and thicknesses of the single-crystal Si substrate 10 and the quartz substrate 20.

When the thickness of the single-crystal Si substrate 10 is substantially equal to that of the quartz substrate 20, there is a large difference between a thermal expansion coefficient of the single-crystal silicon ($2.33 \times 10^{-6}$) and a thermal expansion coefficient of the quartz ($0.6 \times 10^{-6}$). Therefore, when the heat treatment is performed at a temperature exceeding 300° C., cracks due to a thermal strain or delamination on the bonding front surface may occur owing to a difference in rigidity between both the substrates, or the single-crystal silicon substrate or the quartz substrate may be broken in an extreme case. From such a viewpoint, 300° C. is selected as an upper limit of the heat treatment temperature.

After such a treatment, sheet thickness reduction including at least a chemical etching step is performed with respect to the bonded silicon substrate from a back surface thereof so that the thickness of the single-crystal Si substrate 10 is set to L or below. In this embodiment, the sheet thickness is reduced to a thickness of approximately 30 μm by mechanical polishing, and then finishing sheet thickness reduction is carried out based on chemical etching. The chemical etching at the later step is performed by immersing the bonded substrate in an alkaline solution (a liquid temperature: 80° C.) containing 10% of KOH. Under this etching condition, an etching rate of the single-crystal Si substrate 10 is 0.6 to 0.7 μm/minute, and an etching rate of the quartz can be substantially ignored.

As an etchant used in chemical etching, there is an alkaline solution containing NaOH, CsOH, $NH_4OH$, EDP (Ethylene-diamine-pyrocatechol) or TMAH (Tetramethyl ammonium hydroxide) besides KOH. It is to be noted that, when performing mechanical polishing, adopting CMP (chemical mechanical polishing processing) is preferable. Based on such a sheet thickness reduction processing, the high-concentration boron added p layer 11 alone remains as an SOI layer on the quartz substrate 20 (FIG. 1(F)).

The thus obtained SOI layer has a uniform thickness in the quart substrate surface, and an average value of RMS acquired by measuring a region of 10 μm×10 μm on the front surface by an atomic force microscope (AFM) is as excellent as 5 nm or below.

Then, the obtained SOI substrate is subjected to a heat treatment in a hydrogen containing atmosphere to outwardly diffuse B from the high-concentration boron added p layer 11, thereby obtaining a boron added p layer 12 having a desired resistance value (FIG. 1(G)). During this heat treatment, B in the silicon crystal diffuses toward the outside of the crystal in a state where B is coupled with hydrogen in the heat treatment atmosphere (e.g., $BH_3$ or $B_2H_6$), and the B concentration in the high-concentration boron added p layer 11 is reduced with a treatment time. The heat treatment in this embodiment is a treatment carried out in an atmosphere of a mixed gas containing nitrogen and hydrogen at 1000° C. for eight hours.

It is to be noted that a heat treatment temperature and a heat treatment time are dependent on a diffusion length of B that is outwardly diffused. Therefore, appropriate conditions are selected in accordance with the thickness of the high-concentration boron added p layer 11, the B concentration in this layer, and a final degree of a B concentration in the SOI layer. However, in the present invention, an upper limit of the heat treatment temperature is set to 1250° C. in view of a softening point of the insulative substrate used, and 700° C. is selected as a lower limit of the temperature at which B can be diffused.

It is to be noted that a film thickness of the single-crystal Si (i.e., the high-concentration boron added p layer 11) has been already reduced to a μm level, and hence cracks due to a thermal strain between this single-crystal Si substrate 10 and the quartz substrate 20 or delamination on the bonding front surface does not occur even if the heat treatment is carried out at such a high temperature.

When a resistivity of the boron added p layer 12 of the thus obtained SOI substrate was measured by a four-point probe method, a value of approximately 0.5 Ωcm (approximately $3 \times 10^{16}/cm^3$ when converted into a B concentration) was acquired, and resistivity uniformity in the substrate surface was also excellent.

As explained above, according to the technique of the present invention, a difference in B concentration between the high-concentration boron added p layer 11 and the single-crystal Si substrate 10 can be raised to increase the "etching selectivity" (the selection ratio) in the etch-back method and, on the other hand, a resistance value of the SOI layer can be controlled to a desired value after forming the SOI layer.

Further, in the present invention, since the support substrate is an insulative substrate formed of a material other than silicon, there is an advantage that etching with respect to the support substrate when the support substrate is immersed in an alkaline solution to be etched back does not have to be factually considered.

Furthermore, when the silicon substrate is the support substrate, B outwardly diffused during the heat treatment in the hydrogen containing atmosphere is again diffused in the silicon substrate, and this becomes a factor that fluctuates a resistivity of the SOI layer in a subsequent thermal process. However, when the support substrate is the insulative substrate like the present invention, such a problem can be avoided. In particular, when synthetic fused silica is used for the substrate, a B concentration is 1 ppb or below, and hence this substrate does not become a diffusion source of B into the SOI layer.

The present invention provides the method for manufacturing the SOI substrate superior in film thickness uniformity and resistivity uniformity in the substrate surface of the silicon layer (the SOI layer) having the film thickness reduced by the etch-back method.

What is claimed is:

1. A method for manufacturing an SOI substrate comprising: bonding a front surface of a silicon substrate having a high-concentration boron added type-p layer having a depth L in an outermost front surface to a front surface of an insulative substrate, wherein a specific resistance of the high-concentration boron added type-p layer is 0.01 Ωcm or below; reducing a sheet thickness of the bonded silicon substrate from a back surface thereof by a sheet thickness reducing technique including at least a chemical etching step to set a thickness of the silicon substrate to L or below; and performing a heat treatment with respect to the silicon layer having the thickness which is L or below in a hydrogen containing atmosphere.

2. The method for manufacturing an SOI substrate according to claim 1, wherein the depth L of the high-concentration boron added type-p layer from the outermost front surface of the silicon substrate is 10 μm or below.

3. The method for manufacturing an SOI substrate according to claim 1, wherein an etchant used for the chemical etching is an alkaline solution containing KOH, NaOH, CsOH, NH$_4$OH, EDP (Ethylenediamine-pyrocatechol), or TMAH (Tetramethyl ammonium hydroxide).

4. The method for manufacturing an SOI substrate according to claim 2, wherein an etchant used for the chemical etching is an alkaline solution containing KOH, NaOH, CsOH, NH$_4$OH, EDP (Ethylenediamine-pyrocatechol), or TMAH (Tetramethyl ammonium hydroxide).

5. The method for manufacturing an SOI substrate according to claim 1, wherein a heat treatment temperature in the hydrogen containing atmosphere is in the range of 700° C. to 1250° C.

6. The method for manufacturing an SOI substrate according to claim 2, wherein a heat treatment temperature in the hydrogen containing atmosphere is in the range of 700° C. to 1250° C.

7. The method for manufacturing an SOI substrate according to claim 1, wherein the bonding the front surface of the silicon substrate to the front surface of the insulative substrate comprises: a front surface treatment step of performing an activation treatment with respect to the front surface of at least one of the insulative substrate and the silicon substrate; and a step of bonding the front surface of the insulative substrate to the front surface of the silicon substrate at a room temperature.

8. The method for manufacturing an SOI substrate according to claim 2, wherein the bonding the front surface of the silicon substrate to the front surface of the insulative substrate comprises: a front surface treatment step of performing an activation treatment with respect to the front surface of at least one of the insulative substrate and the silicon substrate; and a step of bonding the front surface of the insulative substrate to the front surface of the silicon substrate at a room temperature.

9. The method for manufacturing an SOI substrate according to claim 7, wherein the activation treatment is at least one of a plasma treatment and an ozone treatment.

10. The method for manufacturing an SOI substrate according to claim 8, wherein the activation treatment is at least one of a plasma treatment and an ozone treatment.

11. The method for manufacturing an SOI substrate according to claim 1, wherein the insulative substrate is formed of any one of quartz, sapphire, borosilicate glass, crystallized glass, and a silicon carbide.

12. The method for manufacturing an SOI substrate according to claim 2, wherein the insulative substrate is formed of any one of quartz, sapphire, borosilicate glass, crystallized glass, and a silicon carbide.

* * * * *